United States Patent
Mejri et al.

(10) Patent No.: US 10,340,956 B2
(45) Date of Patent: Jul. 2, 2019

(54) MAP DECODING METHOD USING AUGMENTED LATTICES

(71) Applicant: Institut Mines-Telecom, Paris (FR)

(72) Inventors: Asma Mejri, Paris (FR); Ghaya Rekaya-Ben Othman, Antony (FR)

(73) Assignee: INSTITUT MINES-TELECOM, Paris (FR)

(*) Notice: Subject to any disclaimer, the term of this patent is extended or adjusted under 35 U.S.C. 154(b) by 0 days.

(21) Appl. No.: 15/026,433

(22) PCT Filed: Sep. 29, 2014

(86) PCT No.: PCT/EP2014/070763
§ 371 (c)(1),
(2) Date: Mar. 31, 2016

(87) PCT Pub. No.: WO2015/049194
PCT Pub. Date: Apr. 9, 2015

(65) Prior Publication Data
US 2016/0226527 A1 Aug. 4, 2016

(30) Foreign Application Priority Data
Oct. 1, 2013 (FR) .................................... 13 59497

(51) Int. Cl.
*H03M 13/39* (2006.01)
*H03M 13/00* (2006.01)
(Continued)

(52) U.S. Cl.
CPC ..... *H03M 13/3916* (2013.01); *H03M 13/616* (2013.01); *H03M 13/63* (2013.01);
(Continued)

(58) Field of Classification Search
CPC .......... H03M 13/3916; H03M 13/616; H03M 13/63; H04L 1/0077; H04L 1/06; H04L 25/03171; H04L 1/0076; H04L 2001/0097
See application file for complete search history.

(56) References Cited

U.S. PATENT DOCUMENTS

| | | | | |
|---|---|---|---|---|
| 4,959,842 A | * | 9/1990 | Forney, Jr. .......... | H04L 27/3477 332/103 |
| 6,023,783 A | * | 2/2000 | Divsalar ............. | H03M 13/256 375/262 |
| 2009/0238426 A1 | * | 9/2009 | Fear ..................... | G06K 9/3216 382/128 |

OTHER PUBLICATIONS

Asma Mejri, et al., "Lattice Decoding for the Compute-and-Forward Protocol", Third International Conference on Communications and Networking (COMNET), 2012, IEEE, Mar. 29, 2012.
(Continued)

*Primary Examiner* — Kyle Vallecillo
(74) *Attorney, Agent, or Firm* — Pearne & Gordon LLP

(57) ABSTRACT

The invention relates to a MAP decoding method of a signal received through a noisy channel, the signal being composed of symbols in an alphabet having a non-uniform probability distribution, the symbols being represented by points in a lattice ($\Lambda$). The probability distribution of symbols is modeled using a Gaussian distribution. An augmented lattice ($\Lambda_{exp}$) is formed from the lattice ($\Lambda$) and the ratio ($\beta$) between variance of the noise and variance of the Gaussian distribution of symbols. Therefore, the disclosed MAP decoding method consists essentially of decoding using an ML criterion searching the point in the augmented lattice closest to the point representative of the received signal ($y_{exp}$).

8 Claims, 3 Drawing Sheets

(51) Int. Cl.
  *H04L 1/06* (2006.01)
  *H04L 25/03* (2006.01)
  *H04L 1/00* (2006.01)

(52) U.S. Cl.
  CPC .......... *H04L 1/06* (2013.01); *H04L 25/03171* (2013.01); *H04L 1/0076* (2013.01); *H04L 2001/0097* (2013.01)

(56) References Cited

OTHER PUBLICATIONS

Asma Mejri, et al., "On the Diversity of the Naive Lattice Decoder", 7th International Workshop on Systems, Signal Processing and their Applications (WOSSPA), 2011, IEEE, May 9, 2011.

Ido Nevat, et al., "Detection of Gaussian Constellations in MIMO Systems Under Imperfect CSI", IEEE Transactions on Communications, vol. 58, No. 4, Apr. 2010.

Shengli Zhang, et al., "Physical Layer Network Coding", Proc. of ACM Mobicom, 2006.

International Search Report issued in Application No. PCT/EP2014/070763 dated Dec. 12, 2014.

Search Report issued in French Patent Application No. FR 13 59497 dated May 19, 2014.

Written Opinion issued in Application No. PCT/EP2014/070763 dated Dec. 12, 2014.

Emanuele Viterbo et al., "A Universal Lattice Code Decoder for Fading Channels" IEEE Transactions on Information Theory, vol. 45, No. 5, Jul. 1999.

Ghaya Rekaya Ben-Othman et al., "The spherical bound stack decoder" IEEE International Conference on Wireless & Mobile Computing, Networking & Communication, 2008.

\* cited by examiner

MAP DECODING METHOD USING AUGMENTED LATTICES

TECHNICAL DOMAIN

This invention relates to the domain of digital telecommunications and more particularly decoding of an information source of which the symbols do not follow a uniform distribution. It is particularly applicable to decoding in networks using a physical layer network coding technique.

STATE OF PRIOR ART

Digital communications are usually based on a discrete channel model between a transmitter capable of transmitting messages composed of symbols and a receiver capable of reproducing the message from the received signal.

A discrete channel can be considered as being a stochastic system accepting symbols $x_i$ belonging to an alphabet $A_X$ as input, and providing symbols $y_i$ belonging to an alphabet $A_Y$ as output, the channel inputs and outputs being related by a probabilistic model defined by probabilities:

$$P(Y_1=y_1, \ldots, Y_m=y_m | X_1=x_1, \ldots, X_n=x_n) \quad (1)$$

In practice the channel is noisy, in other words symbols at the output from the channel are affected by noise that is usually assumed to be additive white Gaussian noise (AWGN). $R_i=Y_i+Z_i$, $i=1, \ldots, m$ denote the samples of the received signal samples in which z, are noise samples.

The receiver searches for the most probable sequence of symbols $x_1, \ldots, x_n$ given the received signal, in other words it searches for the sequence of input symbols that maximises the conditional probability:

$$P(X_1=x_1, \ldots, X_n=x_n | R_1=r_1, \ldots, R_m=r_m) \quad (2)$$

that we will denote more simply as P(X|R) where X is the vector of input symbols that is to be estimated and R the vector of the received signal samples.

In other words, we search for the vector $\hat{X}$ that maximises the probability:

$$P(X|R)=P(R|X)P(X)/P(R) \quad (3)$$

Since the term P(R) is independent of X, all that is necessary is to search for the vector $\hat{X}$ maximising the probability:

$$P(R|X)P(X) \quad (4)$$

At this stage, a distinction is made between two types of decoding methods. The first decoding type uses a criterion called the Maximum Likelihood (ML) criterion, based on the assumption that the symbols in the alphabet $A_X$ are equally probable. All that is then necessary is to maximise P(R|X), in other words when the channel has no memory:

$$\hat{X}_{ML} = \underset{X}{\operatorname{argmax}} P(R | X) = \prod_{i=1}^{m} \underset{x_i}{\operatorname{argmax}} P(R_i | x_i) \quad (5)$$

This decoding method is optimal when the input symbols are effectively equally probable, in other words when the alphabet $A_X$ has a uniform probability distribution.

A second type of decoding, called Maximum A Posteriori (MAP) decoding, does not make this simplifying assumption. Consequently, conditional probabilities have to be weighted by the probabilities of input symbols according to expression (5). When the channel has no memory, this expression becomes:

$$\hat{X}_{MAP} = \underset{X}{\operatorname{argmax}} P(R | X) = \underset{x_i}{\operatorname{argmax}} \prod_{i=1}^{m} P(R_i | x_i) P(x_i) \quad (6)$$

Although a large number of information sources have a non-uniform probability distribution of the symbols of their alphabet (hereinafter denoted non-uniform information sources), ML decoding is usually preferred due to its greater simplicity, despite its sub-optimal nature.

Non-uniform information sources include most multimedia information sources (text, speech, audio, video) due to the strong correlation between successive symbols (bits) contained in them. Although information compression can strongly reduce this redundancy, it does not eliminate it completely.

Non-uniformity of the probability distribution of the symbols to be decoded is not necessarily the result of the information source but it may be due to the communication strategy used. Thus, relay terminals in cooperative networks using a physical layer network coding technique, receive combinations of signals originating from different source terminals. An introduction to physical layer network coding is given in the article by S. Zhang et al. entitled «Physical Layer Network Coding», published in Proc. Of ACM Mobicom, 2006, pp. 358-365. Although the probability distribution of symbols transmitted by the source terminals is uniform, the combination of these symbols at the relay terminal is not. Thus, in the simple example shown in FIG. 1 in which two source terminals $S_1, S_2$ transmit symbols $x_1$ and $x_2$ to two relay terminals $R_1, R_2$ that decode them before recoding them if necessary and retransmitting them to a destination terminal D, if gains of unit channels are assumed between sources and relays, the relays will both receive the sum symbol $x_1+x_2$. If the source terminals use a BPSK alphabet with uniform probability, the probabilities of sum symbols −2, 0, 2 will be ¼, ½ and ¼ respectively. More generally, if a relay terminal receives BPSK symbols from a plurality of K source terminals, the sum symbol received from the relay will follow a binomial probability distribution B(K,2). The same conclusion is valid for QPSK symbols, the probability distribution then being binomial on each axis in phase and in quadrature.

In the two cases mentioned above, original non-uniformity of the information source, non-uniformity induced by the network, the receiver needs to decode information symbols belonging to an alphabet with a non-uniform probability distribution.

As mentioned above, the optimal decoding method is MAP decoding but it is difficult to achieve in practice due to its high complexity. In particular, in the context of network coding, an exhaustive search has to be made on all possible combinations of symbols from the different source terminals. Furthermore, ML decoding is sub-optimal in terms of the error rate. Furthermore, existing ML decoding methods in a telecommunication system using network coding are also very complex.

The article by Nevat et al. entitled «*Detection of Gaussian constellations in MIMO systems under imperfect CSI*» published in IEEE Trans. on Com., vol. 58, No. 4, April 2010, pp. 1151-1160 discloses a MAP detector in a MIMO system, the received symbols having a quasi-Gaussian amplitude distribution following formatting in transmission.

Consequently, the purpose of this invention is to disclose a method of decoding information symbols belonging to an alphabet with a non-uniform probability distribution, that is significantly simpler than MAP decoding by an exhaustive search and that has a lower error rate than that obtained by conventional decoding by maximum likelihood (ML).

PRESENTATION OF THE INVENTION

This invention is defined by a MAP decoding method of a signal received through a noisy channel, said signal being composed of symbols belonging to a predetermined alphabet, affected by additive white Gaussian noise, the probability distribution of the symbols within this alphabet being non-uniform, the symbols being represented by points in a lattice $\Lambda=\{x|x=Ma, a \in Z^N\}$ generated by a matrix M with dimension N×N, in which:
a vector y with dimension N representative of the received signal is determined;
an augmented vector $$y_{exp} = \begin{bmatrix} y \\ 0_N \end{bmatrix}$$

is created in which $0_N$ is a null vector with dimension N;
an augmented lattice $\Lambda_{exp}=\{x|x=M_{exp}a, a \in Z^N\}$ with generator matrix $$M_{exp} = \begin{bmatrix} M \\ \beta M \end{bmatrix}$$

is formed in which $$\beta = \frac{\sigma^2}{\sigma_V^2}$$

is the ratio between variance of the noise and variance of a Gaussian probability distribution modelling the non-uniform probability distribution of the symbols in the alphabet;
a search is made among the points in the augmented lattice to find the point closest to the vector representative of the received signal, â;
the received symbol is estimated from the generating matrix M and the closest neighbour, $\hat{v}_{MAP*}=M\hat{a}$.

Advantageously, the search for the closest neighbour is limited to a finite sub-set $\Omega_a$ of the lattice representing a constraint on the signal energy.

According to a first embodiment of the invention, the noisy channel is a channel composed of a plurality K of elementary channels between the source terminals and a relay terminal of a network and each of the symbols is composed of a combination of elementary symbols transmitted by the corresponding source terminals to said relay terminal, each said elementary symbol belonging to an elementary alphabet of a source terminal.

In one exemplary application, the elementary alphabets of the source terminals are identical and the variance $\sigma_V^2$ of the Gaussian probability distribution modelling the non-uniform distribution of symbols in the alphabet is obtained by $\sigma_V^2=K\sigma_X^2$, where $\sigma_X^2$ is the variance of the probability distribution of elementary symbols within an elementary alphabet.

In this case, the variance $\sigma_X^2$ is obtained by $\sigma_X^2=NP_{max}$ where $P_{max}$ is the maximum transmission power of a source terminal.

Advantageously, the search for the nearest neighbour is made using a sphere decoder and sphere decoding uses an enumeration of points according to Pohst's algorithm.

Alternately, the search for the closest neighbour could be made by decoding using a stack decoder with a spherical bound.

BRIEF DESCRIPTION OF THE DRAWINGS

Other characteristics and advantages of the invention will become clear after reading preferred embodiments of the invention, with reference to the appended figures among which.

DETAILED PRESENTATION OF PARTICULAR EMBODIMENTS

Figure 1:
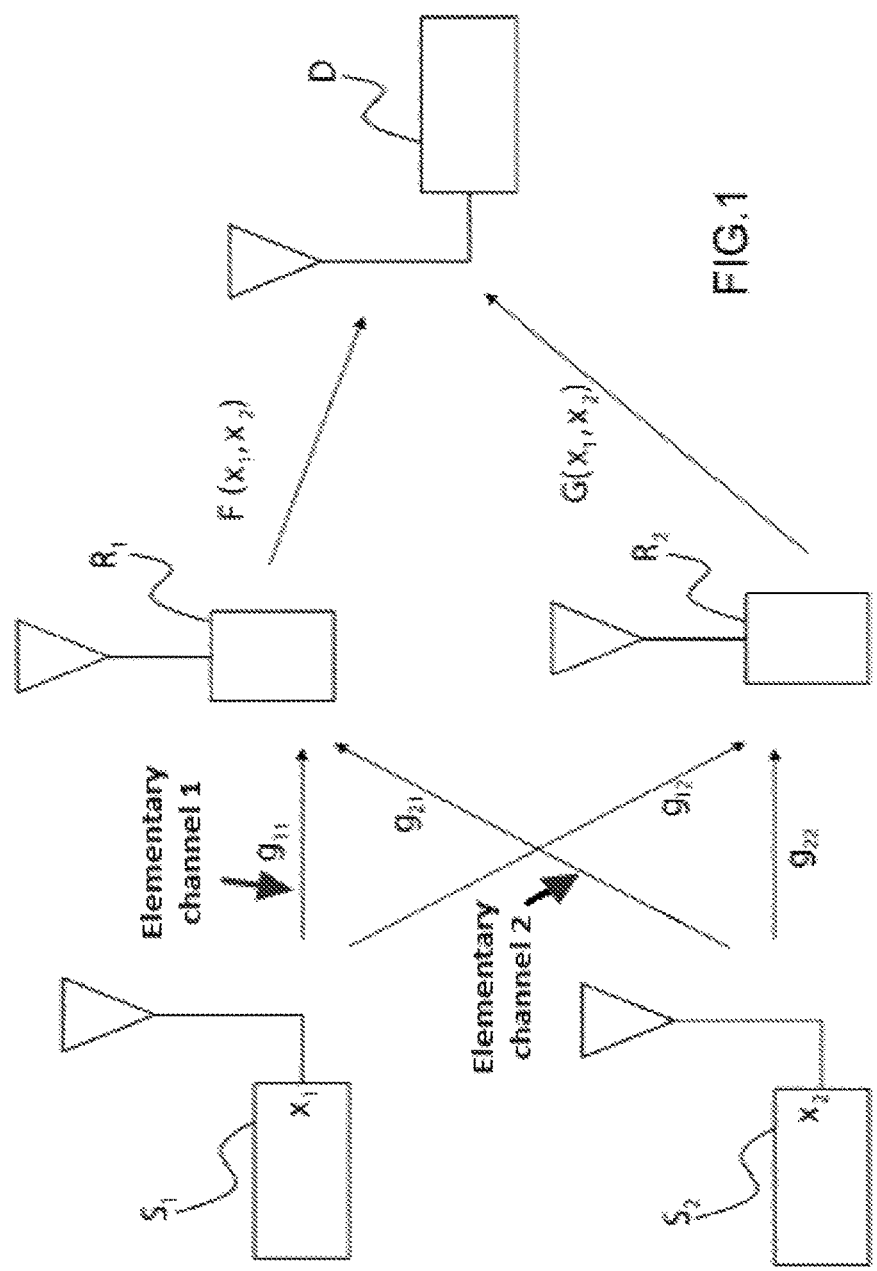
FIG. 1 shows a simplified example of a cooperative network using physical layer network coding.

In the following, we will consider an alphabet of information symbols with a non-uniform probability distribution. In other words, the symbols in this alphabet are not equally probable.

This alphabet may for example be the alphabet used by a non-uniform information source or it may be the result of a combination at a relay in a cooperative network making use of physical layer network coding.

For illustration purposes and without reducing generalisation, we will disclose the decoding method according to the invention as part of a cooperative network. To achieve this, we will assume that K source terminals $S_1, \ldots, S_K$ transmit K symbols $x_1, \ldots, x_K$ respectively, and that a relay terminal receives a signal corresponding to a combination of these symbols, namely:

$$\frac{1}{N}E\{\|x\|^2\} \le P_{max} \qquad (8)$$

where $g_k$, k=1, ..., K are the gains of each of the channels between the source terminals and the relay terminal. Without reducing generality, we will assume that these gains are equal to 1.

Symbols $x_k$ are elements of a finite alphabet $A_X=\Lambda \cap \Omega$, called the elementary alphabet, in which $\Lambda$ is a lattice of dimension N, and $\Omega$ is a convex of $\mathbb{R}^N$, containing the origin and defining the transmission power constraint of a source terminal (assumed to be identical for all terminals).

For example, if the symbols $x_k$ are elements in a QAM alphabet, the lattice dimension will be 2. Remember that a lattice with dimension N is generally defined by a matrix M with dimension N×N, in which the column vectors of the matrix are called the lattice generator vectors, a point x in the lattice being defined in a vector form by x=Ma where $a \in Z^N$ is a vector with dimension N in which the elements are integers. However, it is understood that the origin of the lattice is not considered for a QAM alphabet ($a \neq 0_N$). Nevertheless it will be understood that we can always consider gains $g_k$ equal to 1, provided that the matrix M can be modified.

The convex $\Omega$ is typically a sphere of $\mathbb{R}^N$ centred at the origin, the radius of the sphere being given by the maximum transmission power of the source terminal. Thus, if $P_{max}$ is the maximum transmission power of a source terminal, the convex $\Omega$ can be defined by points x, such that:

$$y = \sum_{k=1}^{K} g_k x_k + z \tag{7}$$

where $E\{.\}$ is the mean value.

The vector z in the expression (7) is a noise vector with dimension N the components of which are random Gaussian variables with zero mean and variance $\sigma^2$.

The relay terminal is provided with a decoder to decode the sum $$v = \sum_{k=1}^{K} x_k.$$

After decoding if applicable, the relay terminal transmits it to the destination terminal.

The sum symbol $$v = \sum_{k=1}^{K} x_k$$

belongs to an alphabet $A_V$ resulting from superposition of elementary alphabets $A_X$. Given that the lattice $\Lambda$ is stable by addition ($\Lambda$ with the addition has a group structure), the sum symbol v still belongs to the lattice $\Lambda$. The result is that the lattice $\Lambda_V$ defining the alphabet $A_V$ is a sub-set of $\Lambda$ ($\Lambda_V \subset \Lambda$). The alphabet $A_V$ of sum symbols is such that $A_V = \Lambda_V \cap \Omega_V$ where $\Omega_V$ is a convex of $\mathbb{R}^N$: reflecting the transmission power constraint of K source terminals.

MAP decoding at the relay would result in a search for the sum vector $\hat{v}_{MAP}$ such that:

$$\hat{v}_{MAP} = \operatorname*{argmax}_{v \in \Lambda_V}(P(v \mid y)) = \operatorname*{argmax}_{v \in \Lambda_V}(P(v)P(y \mid v)) \tag{9}$$

also such that:

$$\hat{v}_{MAP} = \operatorname*{argmin}_{v \in \Lambda_V}\left(-\ln(P(v)) + \frac{\|y-v\|^2}{2\sigma^2}\right) \tag{10}$$

taking account of the fact that $$P(y \mid v) = \exp\left(-\frac{\|y-v\|^2}{2\sigma^2}\right).$$

The basic idea of the invention is to model the sum symbol v using a random Gaussian variable with zero mean and variance $\sigma_V^2 = K\sigma_X^2 = KNP_{max}$. This approximation is justified by application of the central limit theorem to the random variables $x_k$.

Based on this approximation, the probability distribution law of the sum symbol is given as follows:

$$P(v) = \frac{1}{(\sigma_V \sqrt{2\pi})^N} \exp\left(-\frac{\|v\|^2}{2\sigma_V^2}\right) \tag{11}$$

In substituting this estimation of P(v) in the expression (10), we obtain a new decoding criterion:

$$\hat{v}_{MAP^*} = \operatorname*{argmin}_{v \in \Lambda_V}\left(N\ln(\sigma_V \sqrt{2\pi}) + \frac{1}{2\sigma_V^2}\|v\|^2 + \frac{1}{2\sigma^2}\|y-v\|^2\right) \tag{12}$$

Considering that the first term does not depend on v, decoding consists of determining:

$$\hat{v}_{MAP^*} = \operatorname*{argmin}_{v \in \Lambda_V}\left(\|y-v\|^2 + \frac{\sigma^2}{\sigma_V^2}\|v\|^2\right) \tag{13}$$

A vector, $y_{exp}$ called an augmented vector, with dimension 2N, resulting from the vertical concatenation of vector y and a null vector with dimension N, is added, namely $$y_{exp} = \begin{bmatrix} y \\ 0_N \end{bmatrix}$$

and a full rank matrix $$B = \begin{bmatrix} I_N \\ \beta I_N \end{bmatrix}$$

where $I_N$ is the unit matrix with dimension N×N and $\beta$ is a coefficient reflecting the ratio between the noise variance and the variance of the sum symbol to be decoded, namely $$\beta = \frac{\sigma^2}{\sigma_V^2}.$$

The decoding criterion (13) can then be expressed as follows:

$$\hat{v}_{MAP^*} = \operatorname*{argmin}_{\substack{v=Ma \\ a \in \Omega_a}}(\|y_{exp} - BMa\|^2) \tag{14}$$

in which the condition on the transmission power limit is shown by constraining the vector a to belong to a subset of $Z^N$ such that the transmission power constraint is satisfied, in other words $$\Omega_a = \left\{ a \in Z^N \mid \frac{1}{N} E\{\|Ma\|^2\} \leq P_{max} \right\}.$$

If we define the augmented matrix $M_{exp}$ with dimension 2N×N by $$M_{exp} = BM = \begin{bmatrix} M \\ \beta M \end{bmatrix},$$

the decoding criterion is finally expressed in the following form:

$$\hat{v}_{MAP^*} = \underset{\substack{v=Ma \\ a \in \Omega_a}}{\operatorname{argmin}}(\|y_{exp} - M_{exp}a\|^2) \quad (15)$$

in other words, this is equivalent to searching for the point in an augmented lattice $\Lambda_{exp}$, generated by the matrix $M_{exp}$, that is closest to the point $y_{exp}$, representing the received signal. Consequently, it will be understood that it is equivalent to a conventional ML decoding in an augmented space, with dimension 2N, the lattice $\Lambda_{exp}$ and the point representative of the received signal $y_{exp}$ both being dimension 2N.

The search for the closest neighbour of $y_{exp}$ in the augmented lattice $\Lambda_{exp}$ may be made classically using sphere decoding. It should be remembered that sphere decoding can limit the search for the closest neighbour to lattices belonging to a noise ball centred at the point representing the received signal. A description of sphere decoding is given in the article by E. Viterbo et al. entitled «*A universal lattice code decoder for fading channels*» published in IEEE Transactions on Information Theory, vol. 45, pages 1639-1642, July 1999. A spherical bound stack decoder (SB) can also be used as described in article by G. Rekaya Ben-Othman entitled «*The spherical bound stack decoder*» published in Proc. of IEEE International Conference on Wireless & Mobile Computing, Networking & Communication, pp. 322-327.

The search for the closest neighbour using the sphere decoder could in particular use a Pohst enumeration, known in itself.

The sphere decoder starts from a noise sphere with radius C centred at the point $y_{exp}$ representative of the received signal. Points a in the lattice $\Lambda_{exp}$ belonging to this sphere satisfy the following relation:

$$\|y_{exp} - M_{exp}a\|^2 \leq C^2 \quad (16)$$

The search for the closest neighbour must also take account of the fact that the point a must satisfy the power constraint, in other words $a \in \Omega_a$.

In a preliminary step, the augmented matrix $M_{exp}$ is subject to a QR decomposition, in other words $M_{exp} = QR$ where Q is a matrix with dimension 2N×N in which the column vectors are orthogonal and R is an upper triangular matrix with dimension N×N. If we denote $\rho = M_{exp}^{-1} y_{exp}$ (Zero Forcing solution) and $\xi = \rho - a$, relation (16) can be written again as follows:

$$\|R\xi\| \leq C^2 \quad (17)$$

or:

$$\sum_{i=1}^{N} p_{ii} \left( \xi_i + \sum_{j=i+1}^{N} p_{ij} \xi_j \right)^2 \leq C^2 \quad (18)$$

where $p_{ii} = r_{ii}^2$, i=1, ..., N and $$p_{ij} = \frac{r_{ij}}{r_{ii}},$$

j=i+1, ..., N.

The search begins with the $N^{th}$ component of a:

$$-\frac{C}{\sqrt{p_{NN}}} \leq \xi_n \leq \frac{C}{\sqrt{p_{NN}}} \quad (19)$$

namely, considering the fact that $a_n \in Z$:

$$\left\lceil \rho_N - \frac{C}{\sqrt{p_{NN}}} \right\rceil \leq a_n \leq \left\lfloor \rho_N + \frac{C}{\sqrt{p_{NN}}} \right\rfloor \quad (20)$$

Similarly, the search for other components is limited to intervals:

$$\left\lceil -\sqrt{\frac{T_i}{p_{ii}}} + S_i \right\rceil \leq a_i \leq \left\lfloor \sqrt{\frac{T_i}{p_{ii}}} + S_i \right\rfloor \quad (21)$$

where $$S_i = \rho_i + \sum_{j=1}^{N} p_{ij} \xi_j$$

and $T_i = T_{i-1} - p_{ii}(S_{ii} - a_i)$ in which $T_N = C^2$. The search is made from the last component to the first, the choice of a component with a given index of a reducing the search interval for the component with a lower index.

Search intervals (20) and (21) can be expressed using the simplified relation:

$$b_i^- \leq a_i \leq b_i^+, i = 1, \ldots, N \quad (22)$$

$$b_i^- = \left\lceil -\sqrt{\frac{T_i}{p_{ii}}} + S_i \right\rceil \text{ and } b_i^+ = \left\lfloor \sqrt{\frac{T_i}{p_{ii}}} + S_i \right\rfloor$$

Search intervals also have to be restricted to take account of the maximum transmission power constraint, $a \in \Omega_a$. This constraint imposes that each component $a_i$ in a should remain between two bounds:

$$\omega_i^- \leq a_i \leq \omega_i^+, i=1, \ldots, N \quad (23)$$

Therefore, finally, the search interval $I_i$ for each component $a_i$ is reduced to:

$$sup(\omega_i^-, b_i^-) \leq a_i \leq inf(\omega_i^+, b_i^+) \quad (24)$$

Decoding then continues as follows; the first step is to choose a component $a_N$ within the interval $I_N=[\sup(\omega_N^-, b_N^-), \inf(\omega_N^+, b_N^+)]$, and the next step is to search for a candidate for component $a_{N-1}$ within the interval $I_{N-1}=[\sup(\omega_{N-1}^-, b_{N-1}^-), \inf(\omega_{N-1}^+, b_{N-1}^+)]$ for which the bounds were calculated from $a_N$. If there is no value $a_{N-1}$ within this interval, then we return to level N to select another candidate for component $a_N$. The process continues from step to step until level 1 is reached. Once a vector â has been found for which the components satisfy all conditions (24), the radius of the sphere is updated and the search process is iterated by scanning all intervals $I_i$, until the vector â closest to $y_{exp}$ is found. The symbol $\hat{v}_{MAP*}$ is given by $\hat{v}_{MAP*}=$Mâ.

Figure 2:
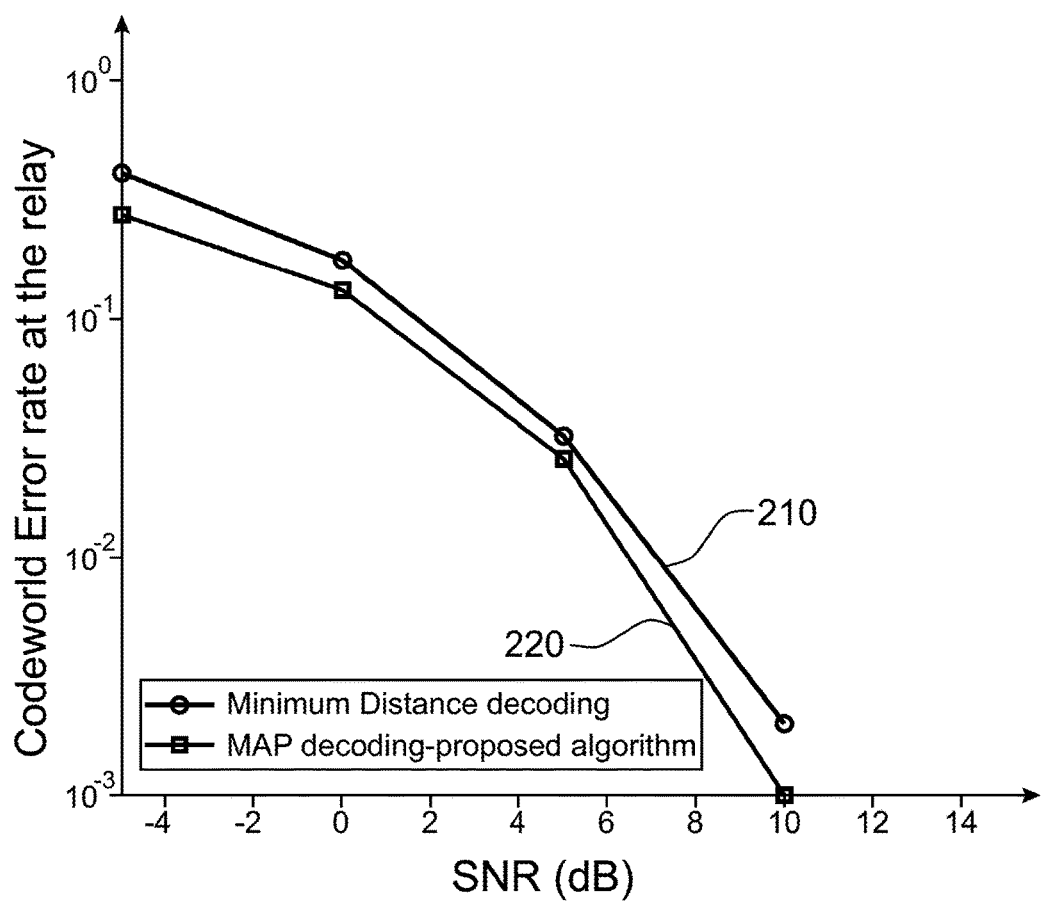
FIG. 2 shows an error rate curve as a function of the signal to noise ratio for an exemplary application of the MAP augmented lattice decoding method according to one embodiment of this invention.

FIG. 2 shows the symbol decoding error rate at the relay, as a function of the signal to noise ratio.

In the case shown, it has been assumed that N=4, K=2 and a maximum transmission power $P_{max}=1$.

210 relates to the curve corresponding to the classical maximum likelihood (ML) decoding method and 220 relates to the curve corresponding to the MAP augmented lattice decoding method according to this invention. This figure confirms that the augmented lattice decoding method enables to achieve a lower symbol error rate for a given signal to noise ratio or to achieve a better signal to noise ratio for a given target symbol error rate. It should have been noted that the gain is higher when the dimension N of the lattice is high.

Those skilled in the art will understand that other search algorithms for the closest neighbour within a lattice and particularly Schnorr-Euchner's decoding could be used instead of the sphere decoder method, without going outside the scope of this invention.

We will disclose the MAP augmented lattice decoding method below, in a general framework.

The decoding method aims at decoding a signal received through a noisy channel, said signal being composed of information symbols belonging to a predetermined alphabet. The probability distribution of information symbols within this alphabet is non-uniform, in other words some information symbols are more frequent than others. Noise affecting the channel is assumed to be white and Gaussian.

It is assumed that symbols in the alphabet can be represented by points in a lattice $\Lambda$ with dimension N defined by the relation $\{x|x=Ma, a \in Z^N\}$ in which M is a lattice generator matrix. This condition is satisfied particularly when symbols belong to a QAM type modulation constellation. The alphabet is a finite sub-part of $\Lambda$, defined as being the intersection between said lattice and a convex $\Omega$ of $\mathbb{R}^N$. However in the case of a QAM alphabet, it should be noted that the origin of the lattice is excluded. The different points in the lattice are weighted by different probability distributions due to the non-uniformity of the probability distribution of symbols in the alphabet.

According to the invention, the probability distribution of symbols in the alphabet is modeled by a Gaussian distribution with variance $\sigma_v^2$.

The signal to be decoded is expressed in the form y=x+z, where x is a point in $\Lambda \cap \Omega$ and z is a noise vector with dimension N of which the components are random variables with variance $\sigma^2$.

Figure 3:
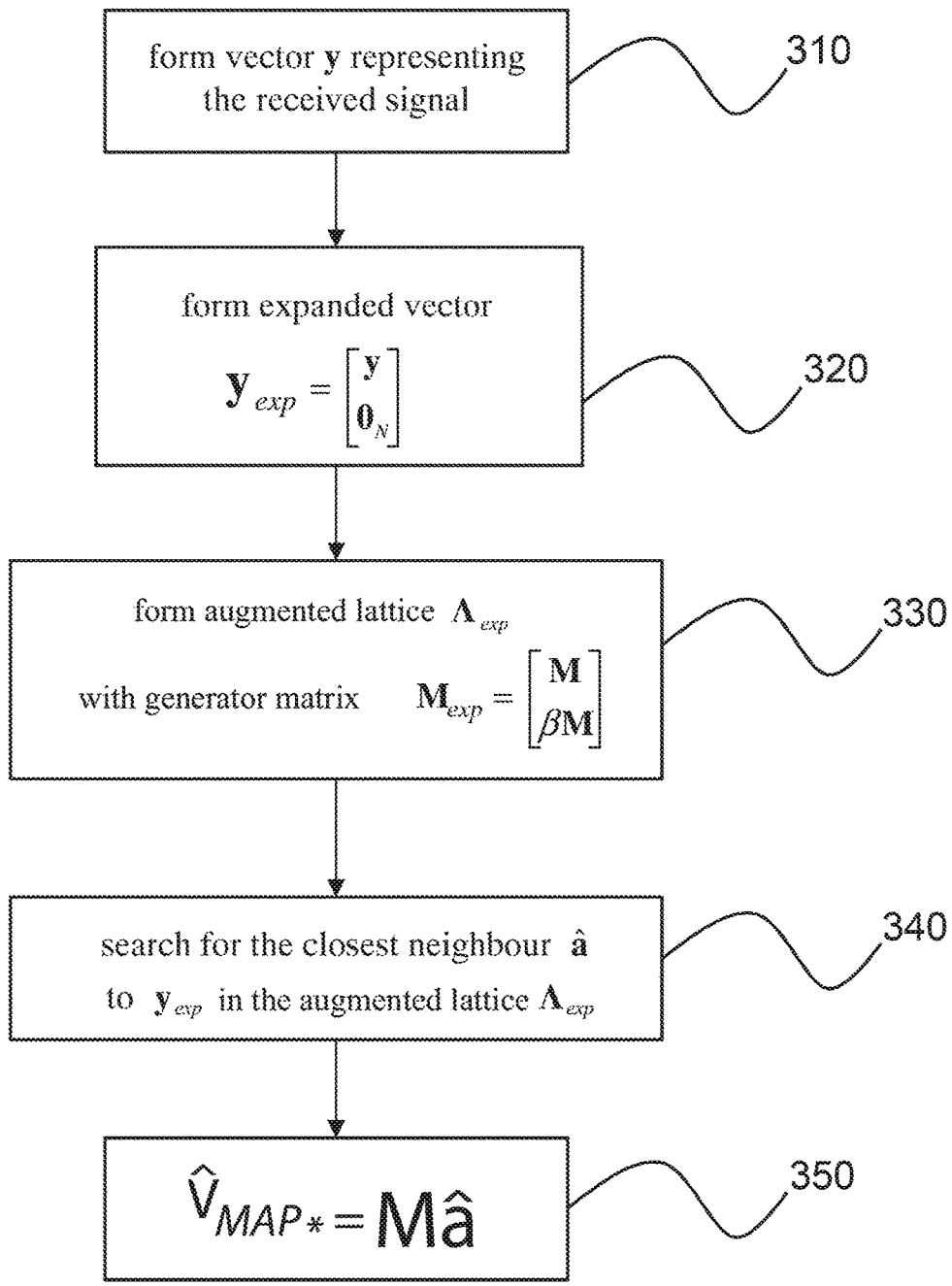
FIG. 3 shows a flowchart of the MAP augmented lattice decoding method according to one embodiment of this invention.

FIG. 3 diagrammatically shows the flowchart for the augmented lattice decoding method according to a general embodiment of the invention.

In step 310, a vector y is formed, representative of the received signal in a space with dimension N where N is the dimension of the lattice $\Lambda$. This vector may for example be obtained by demodulation of the received signal.

In step 320, the augmented vector $$y_{exp} = \begin{bmatrix} y \\ 0_N \end{bmatrix}$$

is constructed.

In step 330, an augmented lattice $\Lambda_{exp}$ with generator matrix $$M_{exp} = \begin{bmatrix} M \\ \beta M \end{bmatrix}$$

is formed, in which M is the generator matrix of the lattice $\Lambda$ and $$\beta = \frac{\sigma^2}{\sigma_v^2}$$

is the ratio between the variance of the noise and the variance of the Gaussian probability distribution modelling the non-uniform probability distribution of symbols in the alphabet.

In step 340, a search is made for the closest neighbour to the augmented vector $y_{exp}$ in the augmented lattice $\Lambda_{exp}$, in other words the vector â of $\Omega_a$ minimising the distance $\|y_{exp}-M_{exp}a\|^2$, where $\Omega_a$ is a part of $Z^N$ reflecting a maximum energy constraint of the received signal.

In step 350, the received symbol in the sense of the MAP criterion is estimated by $\hat{v}_{MAP*}=$Mâ.

It will be understood that the search for the closest neighbour in the lattice can be made using a sphere decoder or a stack decoder with spherical bound, as mentioned above. The different known sphere decoding variants are applicable in this case, particularly those implementing enumeration of points making use of Pohst's algorithm.

Those skilled in the art will understand that decoding of sum symbols for a channel of a cooperative network is a special case of decoding in FIG. 3 since these sum symbols form part of an alphabet obtained by superposition of the elementary alphabets of the different source terminals and that the distribution of sum symbols within this alphabet is non-uniform.

Finally as mentioned above, other closest neighbour search algorithms in a lattice, and particularly Schnorr-Euchner's decoding, could be used without going outside the scope of this invention.

What is claimed is:

1. A MAP decoding method implemented on a decoder for decoding a signal received through a noisy channel, wherein the method comprises:
   receiving, by a relay terminal of a network having a decoder, the signal transmitted by at least one source terminal through a noisy channel, said noisy channel comprising an elementary channel between each source terminal and the relay terminal, the signal being composed of symbols belonging to a predetermined alphabet, affected by an additional Gaussian white noise, a probability distribution of the symbols within the predetermined alphabet being non-uniform, the symbols being represented by points in a lattice $\Lambda=\{x|x=Ma, a \in Z^N\}$ generated by a matrix M with dimension N×N;

determining, by the decoder, a vector y with dimension N representative of the received signal;

determining, by the decoder, an augmented vector $$y_{exp} = \begin{bmatrix} y \\ 0_N \end{bmatrix}$$

in which $0_N$ is a null vector with dimension N;

determining, by the decoder, an augmented lattice $\Lambda_{exp} = \{x | x = M_{exp} a, a \in Z^N\}$ (330) with generator matrix $$M_{exp} = \begin{bmatrix} M \\ \beta M \end{bmatrix}$$

in which $$\beta = \frac{\sigma^2}{\sigma_v^2}$$

is the ratio between variance of the noise and variance of a Gaussian probability distribution modelling the non-uniform probability distribution of the symbols in the alphabet;

searching, by the decoder, among points in the augmented lattice to find a closest neighbour â, which is the point closest to the vector representative of the received signal; and estimating, by the decoder, a received symbol $\hat{v}_{MAP*}$ from the generating matrix M and the closest neighbour â, such that $\hat{v}_{MAP*} = M\hat{a}$, to create a decoded signal.

2. The MAP decoding method according to claim 1, wherein said searching for the closest neighbour â is limited to a finite sub-set $\Omega_a$ of the lattice $\Lambda$ representing a constraint on a signal energy.

3. The MAP decoding method according to claim 1, wherein said noisy channel comprises a plurality of K elementary channels between the source terminals and the relay terminal, each symbol comprising a combination of elementary symbols transmitted by the corresponding source terminals to said relay terminal, each elementary symbol belonging to an elementary alphabet of a source terminal.

4. The MAP decoding method according to claim 3, wherein the elementary alphabets of the source terminals are identical and the variance $\sigma_V^2$ of the Gaussian probability distribution modelling the non-uniform probability distribution of symbols in the alphabet is obtained by $\sigma_V^2 = K\sigma_X^2$ where $\sigma_X^2$ is the variance of the probability distribution of elementary symbols within an elementary alphabet.

5. The MAP decoding method according to claim 4, wherein the variance $\sigma_X^2$ is obtained by $\sigma_X^2 = NP_{max}$ where $P_{max}$ is the maximum transmission power of a source terminal.

6. The MAP decoding method according to claim 1, wherein the search for the closest neighbour â is made using a sphere decoder.

7. The MAP decoding method according to claim 6, wherein the sphere decoding uses an enumeration of points according to Pohst's algorithm.

8. The MAP decoding method according to claim 1, wherein the searching for the closest neighbour â comprises decoding, using a stack decoder with a spherical bound.

* * * * *

UNITED STATES PATENT AND TRADEMARK OFFICE
CERTIFICATE OF CORRECTION

PATENT NO. : 10,340,956 B2  
APPLICATION NO. : 15/026433  
DATED : July 2, 2019  
INVENTOR(S) : Asma Mejri et al.

Page 1 of 1

It is certified that error appears in the above-identified patent and that said Letters Patent is hereby corrected as shown below:

In the Specification

Column 4, Line 45, "$\frac{1}{N}E\{\|x\|^2\} \leq P_{max}$ (8)," should read -- $y = \sum_{k=1}^{K} g_k x_k + z$ (7)--

Column 5, Line 11, "$y = \sum_{k=1}^{K} g_k x_k + z$ (7)," should read -- $\frac{1}{N}E\{\|x\|^2\} \leq P_{max}$ (8) --

Column 10, Line 31, "$\|y_{exp} M_{exp} a\|^2$" should read -- $\|y_{exp} - M_{exp} a\|^2$ --

Signed and Sealed this  
Twenty-fourth Day of November, 2020

Andrei Iancu  
*Director of the United States Patent and Trademark Office*